US008680770B2

(12) United States Patent
Ellingboe et al.

(10) Patent No.: US 8,680,770 B2

(45) Date of Patent: Mar. 25, 2014

(54) POWER SPLITTER

(75) Inventors: Albert Rogers Ellingboe, Dublin (IE); Tomasz Michna, Dublin (IE)

(73) Assignee: Dublin City University, Dublin (IE)

( * ) Notice: Subject to any disclaimer, the term of this patent is extended or adjusted under 35 U.S.C. 154(b) by 637 days.

(21) Appl. No.: 12/934,958

(22) PCT Filed: Apr. 6, 2009

(86) PCT No.: PCT/EP2009/054108

§ 371 (c)(1),
(2), (4) Date: Sep. 27, 2010

(87) PCT Pub. No.: WO2009/121975

PCT Pub. Date: Oct. 8, 2009

(65) Prior Publication Data

US 2011/0025430 A1 Feb. 3, 2011

Related U.S. Application Data

(60) Provisional application No. 61/044,797, filed on Apr. 14, 2008.

(30) Foreign Application Priority Data

Apr. 4, 2008 (GB) .................................. 0806146.7

(51) Int. Cl.

| | |
|---|---|
| ***H01J 61/56*** | (2006.01) |
| ***H03H 7/38*** | (2006.01) |
| ***H01P 5/12*** | (2006.01) |
| ***H01P 1/00*** | (2006.01) |

(52) U.S. Cl.

USPC ......... 315/111.41; 333/33; 333/127; 333/263

(58) Field of Classification Search

USPC ............ 315/111.21–111.91; 333/25, 33, 124, 333/125, 127, 136, 263

See application file for complete search history.

(56) References Cited

U.S. PATENT DOCUMENTS

| | | | | |
|---|---|---|---|---|
| 4,011,529 | A | 3/1977 | Garcia | |
| 4,035,746 | A | 7/1977 | Covington, Jr. | |
| 4,115,746 | A * | 9/1978 | Brady et al. | 331/90 |

(Continued)

FOREIGN PATENT DOCUMENTS

| | | | |
|---|---|---|---|
| DE | 1276147 | | 9/1964 |
| DE | 3928158 | C1 | 8/1989 |
| WO | 02/099925 | A1 | 12/2002 |
| WO | 2004/006483 | A2 | 1/2004 |

(Continued)

OTHER PUBLICATIONS

Mutual Inductance; http://www.electronics-tutorials.ws; Oct. 11, 2009.*

(Continued)

*Primary Examiner* — Benny Lee
*Assistant Examiner* — Rakesh Patel
(74) *Attorney, Agent, or Firm* — Seed IP Law Group PLLC

(57) ABSTRACT

A power splitter and/or combiner is described. The power splitter may be provided as a broadband, passive, divide by N power splitter that may be advantageously employed in providing power to multiple electrodes within a plasma source. The power splitter comprises a transmission line and a plurality of N secondary windings arranged about the transmission lines.

58 Claims, 11 Drawing Sheets

(56) References Cited

U.S. PATENT DOCUMENTS

| | | | | | |
|---|---|---|---|---|---|
| 4,647,868 | A * | 3/1987 | Mueller | 330/286 |
| 5,072,198 | A * | 12/1991 | Taplin et al. | 333/33 |
| 5,121,090 | A * | 6/1992 | Garuts et al. | 333/124 |
| 5,296,823 | A | 3/1994 | Dietrich | |
| 5,830,301 | A * | 11/1998 | Sturzebecher et al. | 156/89.16 |
| 6,658,109 | B1 | 12/2003 | Steinke et al. | |
| 7,342,361 | B2 | 3/2008 | Ellingboe | |
| 8,314,561 | B2 * | 11/2012 | Fisk et al. | 315/111.21 |
| 2004/0085176 | A1 | 5/2004 | Werlau | |
| 2005/0068127 | A1 * | 3/2005 | Ham et al. | 333/238 |

FOREIGN PATENT DOCUMENTS

| | | | |
|---|---|---|---|
| WO | 2004/006483 | A3 | 1/2004 |
| WO | 2006/120239 | A1 | 11/2006 |
| WO | 2009/121975 | A1 | 10/2009 |

OTHER PUBLICATIONS

Great Britain Search Report, dated Apr. 29, 2008, for Great Britain Application No. GB0806146.7, 5 pages.

International Search Report and Written Opinion, mailed Aug. 27, 2009, for PCTAN PCT/EP2009/054108,14 pages.

* cited by examiner

POWER SPLITTER

FIELD OF THE INVENTION

The present invention relates to power splitters and in particular to power splitters for differential power distribution. In a first arrangement, the invention provides a broadband, passive, divide by N power splitter that may be advantageously employed in providing power to multiple electrodes within a plasma source.

BACKGROUND

To energize multiple electrodes in a plasma source using a single RF power source, one needs to split the power into multiple channels. In the case of a plasma source topology with alternate electrodes 180 degrees out of phase with each other—such as that described in PCT/EP2006/062261 the content of which is incorporated herein by reference, where each of the electrodes may be out of phase with that of its neighbor, then it is useful to be able to provide push-pull pairs.

A classical solution to this problem would be to use a 180-degree splitter, followed by a series of N:1 splitters, where 2:1 and 4:1 splitters are typical in high power application, and higher values of n can be found for low power cases. Phase errors between output channels will typically be a couple of degrees, amplitude imbalance of 5%, and power loss of 3%; To create a 1:128 divider using a series of 2:1 splitters would end up in substantial power loss and errors in power to a specific electrode receiving only 70% of the power it should receive (0.95^7). In addition, the systems only function properly with the input and output impedances are matched, typically at 50 Ohms. Because the plasma load on the electrode will be substantially non-50-Ohm, an impedance matching network will be required between the final stage splitter output and the electrode for each electrode. This adds to the cost, complexity, and electrode-to-electrode variation for such a solution. Additionally, such a solution is only matched to specific electrode numbers, where the number of electrodes is factored into the types of splitters (for example a 7×10 electrode array would need the 180-degree splitter, a 5:1 splitter, and a 7:1 splitter) so each solution could require a different engineering solution for the splitters. Further still, the high power splitters (particularly odd-number splittings like 5, 7) are frequency specific, so operating at different frequencies would require different engineering solutions.

For reasons of simplicity, cost savings, and uniformity, it is desirable to have a solution in which the impedance matching is done prior to the splitter, the power splitter is 'passive', the splitter is broad-band (same concept for VHF and UFH frequency range—30-3000 MHz), and that the splitter be able to perform 1:N splitting for large and arbitrary N (advantageously employing a similar design for, N=30, 32, 36 for 3×10, 4×8, 6x6 electrode arrays). There is a further need for a power splitter that can be implemented with high total power efficiency, and drive an output impedance that can drive the plasma electrodes directly and could be configured to drive pairs of electrodes in differential (push-pull) mode.

SUMMARY

These and other problems are addressed by a power splitter provided in accordance with the teaching of the invention. Such a splitter is provided by providing a plurality of secondary windings arranged about a transmission line, the transmission line operably providing an azimuthal magnetic field which inductively couples power into the secondary windings to provide a splitting of the power from the transmission line. It will be appreciated that the number, N, of the secondary windings forming what may be considered a secondary transformer, will determine the splitting ratio, N, of the power splitter. When used with a power source, with the N-secondary transformer located in the region of the high magnetic field, it is possible to inductively couple power into the windings of the N-secondaries via the magnetic field and that power may then be selectively coupled to individual electrodes of the plasma source.

Where it is desirable to provide a configuration where a plurality of electrodes are arranged relative to one another in an array with neighboring electrodes being out of phase with one another, the secondary windings may be arranged in a push pull configuration, such that each winding has a first and second end, each of the ends operably coupled to a respective one of the electrodes. In such an arrangement, the number of windings required is N/2 the number N of the electrodes.

The power splitter may also include an impedance matching circuit. The impedance matching circuit may be provided by a stub tuner. The output of the stub-tuner is connected to a section of transmission line and may be used to match the impedance of the transmission line and the associated power source, to that of the transmission line with additional load formed by the N secondary windings.

In a preferred arrangement the transmission line is provided as a coaxial line. A typical coaxial transmission line will include an inner core or central conductor separated from an outer shield by a dielectric. Such configurations are advantageous in that the transmission of energy in the line occurs totally through the gap between the conductors.

Where the transmission line is in an open configuration a standing wave will develop within the transmission line with a ½ wavelength node to node periodicity. Such an arrangement could be usefully employed for high UHF frequencies where wavelengths are short.

In a preferred arrangement however, the transmission line is shorted. This results in generation of a standing wave on the transmission line, with the short causing a zero-voltage point (a node) and simultaneously a maximum in current (antinode). This high RF current results in a high azimuthal magnetic field generated in the region of the transmission line short, which is desirably provided at an end of the transmission line. By locating the secondary windings in this region it is possible to couple power into the secondary windings in a comparably broadband fashion.

While advantageously employed within the context of plasma sources where a plurality of individual electrodes are powered using such a power coupler, it will be understood that by providing a broadband coupler that a power coupler in accordance with the present teaching could also be usefully employed in any RF application that requires a splitting of power from a power source. Exemplary applications would include RADAR, television or radio antennae, mobile telecommunication antennae and the like. Depending on the application, the device may be operating as a signal splitter as opposed to a conventional power splitter but it will be appreciated that the functionality of the azimuthal coupling of the signal from the transmission line into the secondary windings benefits from the same efficiency as provided in the context of splitting of power signals.

It will be understood that by reversing the configuration used in a power splitter arrangement that the device may also advantageously be employed as a power combiner where two or more input signals are combined onto a single transmission line. In another configuration the device may be suitably configured to provide a combined combiner-splitter where two or more individual signals are combined onto the transmission line and then split again to provide a feed for two or more output lines.

BRIEF DESCRIPTION OF THE DRAWINGS

The present invention will now be described with reference to the accompanying drawings in which:

FIG. 11*a* illustrates a case in which 'too little' power obtained by a set-up in which all secondary loops are the same length. FIG. 11*b* illustrates a case in which 'too much' boosted power is provided to central two electrodes obtained by a set-up in which the length of the winding feeding the two central electrodes is increased by ~33%; and FIG. 11*c* illustrates a good power balance at the electrodes obtained by a set-up in which secondary winding for central two electrodes at ~25% longer than the other 5-windings.

DETAILED DESCRIPTION OF THE DRAWINGS

FIGS. 1 to 4 show an exemplary arrangement whereby an azimuthal magnetic field on a transmission line can be used to induce power into secondary windings arranged along a portion of the transmission line so as to create a power splitter. In the exemplary arrangements that follow the transmission line power splitter includes an impedance matching network in the form of a stub tuner. While described with reference to the exemplary arrangement of a power splitter it will be understood that the arrangement could be equally configured for use as a signal combiner or a power coupler/combiner.

Figure 1:
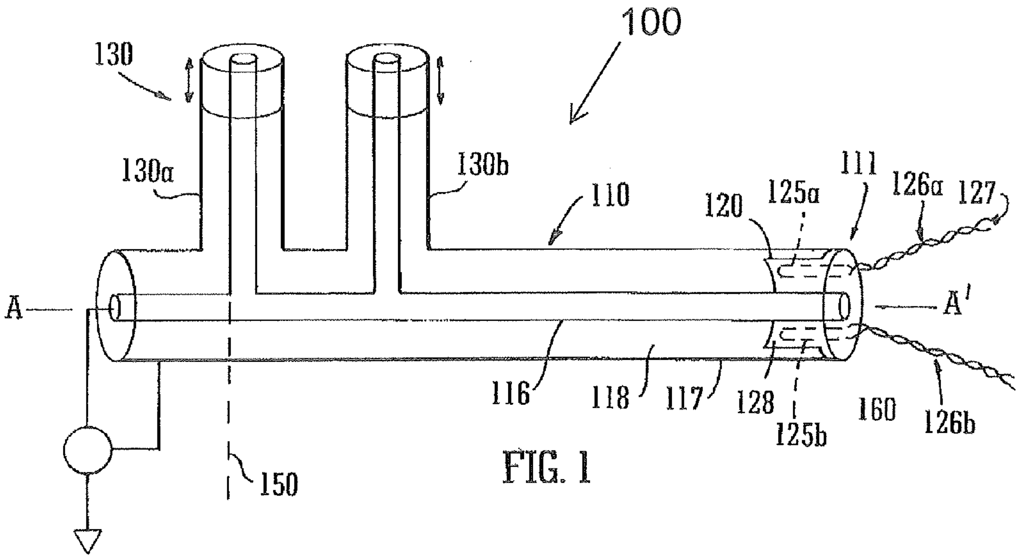
FIG. 1 is a schematic showing a multi-stub tuner operable coupled to a transmission line.

An example of a power splitter 100 provided in accordance with the teaching of the invention is provided in FIG. 1. In this exemplary arrangement such a splitter includes an impedance matching network for VHF/UHF applications. It will be appreciated that the provision of the impedance matching network may be beneficial for certain applications but where impedance matching is not critical that such an arrangement may be omitted. In the described exemplary arrangement, a stub tuner 130 is shown.

As shown in FIG. 1 in the context of two stubs 130*a*, 130*b*, if used, a stub tuner may include one or more individual stubs, each of which may include a sliding short to enable tuning of the stub tuner 130. In this exemplary arrangement, the output of the stub-tuner 130 is connected to a section of transmission line 110 which is shorted at an end portion 111. The transmission line may be provided by a coaxial cable, having an inner core 116 and an outer shield 117 separated by a dielectric 118. By shorting the coaxial cable through for example connection of the inner core 116 to the outer shield 117, (or any other suitable technique to provide for a shorting of the cabling that is used to provide the transmission line) it is possible to generate a standing wave 200 on the transmission line (shown in FIGS. 2A, 2B, 2C), with the short causing a zero-voltage point 205 (a node) and simultaneously a maximum in current 210 (anti-node). The RF wave reflecting off of the short, particularly in combination with the stub-tuner results in high circulating power within the coaxial transmission line from the short as far back as the stub-tuner. Associated with the high circulating power are regions of high RF current and/or voltage. This high RF current results in high azimuthal magnetic field within the transmission line. The present inventor has realized that the high azimuthal magnetic field regions, such as the region close (in wavelength terms) to the short is particularly well suited to inductive coupling to wire loops placed within this volume of the transmission line. It will be understood that the formation of the azimuthal field does not require a shorted transmission line. However, with the short arrangement, the magnitude of the field is increased, with the result that the current/voltage induced on the secondary windings is enhanced through use of a shorted transmission line.

It will be appreciated that by shorting the transmission line that one can establish a ¼ wavelength (anti-node to node) standing wave on the transmission line. If the line is not shorted but instead left open, then it will be appreciated that a voltage anti-node and current node are also established but the position of the current peak on that standing wave is at a ¼ wavelength distance along the transmission line. Such an "open" arrangement results in a voltage anti-node and current node (zero) at the open, so the position of the current peak is back-up the transmission line by ¼ wavelength. This means that the best coupling is (somewhat) more frequency dependent. However, for the high UHF frequencies where wavelengths are short, the fact that there is a ½ wavelength from the open standing wave (node-to-node) rather than a ¼ wavelength from the short (anti-node to node) could be beneficial.

By incorporating a N-secondary transformer 120 (where N is the number of windings on the former) into the region of high magnetic field, it is possible to inductively (via the magnetic field) couple power into the windings 125 of the secondary. In the schematic of FIG. 1, first and second pairs of windings 125*a*, 125*b* are provided but it will be understood that any number of windings 125 could be provided, the number N being related to the amount of power splitting that is required for a specific application. In the exemplary arrangement of FIG. 1, each of the first and second windings 125*a*, 125*b* are coupled to twisted pairs of wires 126*a*, 126*b* that are available externally of the transmission line 110. The ends 127 of the wires 126*a* and 126*b* may be used to couple the power on these wires onto a desired target—such as an electrode within a plasma source. If two wires are provided in each twisted pair, they could be used to generate a push pull pair which when individual ends of each push pull pair are coupled to neighboring electrodes could be used to provide power to each of the neighboring electrodes out of phase with the other. It will be understood that the use of a twisted wire pair configuration provides a differential output. If the ends were attached to electrodes and additionally in parallel to the electrode connections to a passive component such as a resistor, inductor, capacitor, or network of components, then the power transmitted by the twisted pair would be split between the two elements forming the termination of the twisted pair. If the passive element had variable electrical impedance, then the amount of power available to the electrodes could be varied.

The windings 125*a* and 125*b* may be provided on a template or former 128 which maintains their orientation and positioning within the transmission line. The windings are desirably coaxially aligned about the inner core 116 of the transmission line and extend along the major axis A-A' of the line. It is desirable that the wires that are coupled to the windings are taken out the end 160 of the transmission line (which in this exemplary arrangement is where the transmission line is shorted), as opposed to the side walls. The length of overlap of the windings with the inner core can be selected to optimise the amount of power that is desired to be coupled into each of the windings.

If the pairs of wires are fed radially out from the side walls, say at the end of the winding opposite from the short, then the voltage/current on these wires could be substantially unbalanced due to capacitive coupling between the inner and outer sections of the transmission line coupling to the sections of the windings adjacent to them; the radial electric field which increases in magnitude with distance away from the short adds capacitive power coupling to the inductive power coupling, and, as seen in FIGS. 2 (*b*) & (*c*) the electric field is approximately 90° out of phase with the current.

Figure 12:
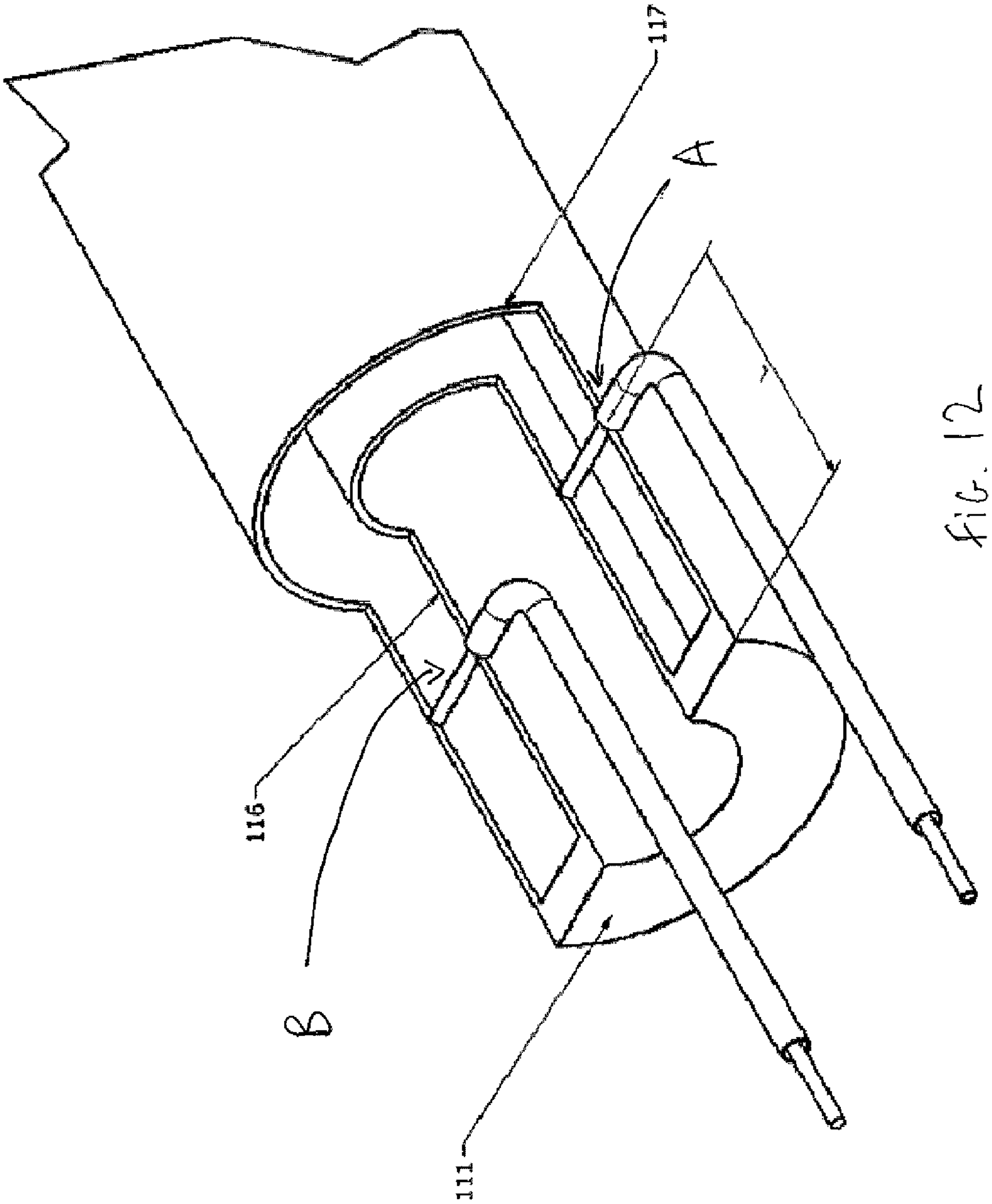
FIG. 12 shows a cut-away view of the power splitter for use in driving single-ended co-axial cables. The connection shown at A is an example of 1-of-N such connections that could be made spread azimuthally around the exterior of the transmission line. The connection shown at B is an example of 1-of-M such connections that could be spread azimuthally around the interior of the transmission line. The volume of the transmission line is filled with dielectric material, which may be air or vacuum, or may be material with desirable electric permativity and magnetic permativity properties.

With reference to FIG. 12 an alternative arrangement for the power splitter is described. In this arrangement N secondary coaxial cables may be arranged around the side walls of the device a distance ‘l’ from the short 111. In the exemplary arrangement the ground shields of the secondary coaxial cables are attached to the outer section of the transmission line 117, and the inside insulated from the outer section 117, but attached to the inner section 116 of the transmission line. For simplicity only a single secondary cable is shown. It will be appreciated that power on the secondary coaxial cables is derived from a radial electrical field inside the transmission line, and that this electric field is directly related to the integrated azimuthal magnetic field between the position of the coaxial cables and the short. It will be further appreciated that the power on the N radially arranged secondary coaxial cables will be in-phase with each other. As noted above in this embodiment the transmission line is shorted and the length or distance l between the short and the position where the inner and outer of the N secondary coaxial cables are connected to the transmission line is controlled to control the relative power coupling between the N coaxial cables It will also be appreciated that M secondary coaxial cables may be located internal to the inner conductor 116 of the transmission line a distance ‘l’ from the short 111, with their outer conductors connected to the inner section 116 of the transmission line, with the inner conductor of the M secondary coaxial cables insulated from the inner conductor 116 but attached to the outer conductor 117. For simplicity only a single coaxial cable is shown. These M secondary cables will be in phase with each other, and they can be routed internal to the transmission line inner conductor 116 exiting the transmission line at the plane of the short 111. If the distance from the short to the location of the inner conductors of the secondary transmission lines is the same, then the phase of the N secondary coaxial cables and the M secondary coaxial cables will be 180° out of phase with each other. The distance l between the short and location of the inner and outer conductors of N and M secondary coaxial cables is controlled to control the relative power coupling between the N and M coaxial cables. Furthermore, if M=N, then the power splitter will provide N push-pull pairs of coaxial lines. In a preferred arrangement M, N>2. In further advantageous arrangements M, N>5. For example, the splitter may have 2N pairs of windings wherein half of the 2N winding are shorted on one end and half of the 2N windings are shorted on the other end to provide N push pull pairs.

It will be understood that as each of the individual windings are independently coupling power from the magnetic field generated by the transmission line that the characteristics of the output signal generated from each winding can be modified independently of the characteristics of the other windings. For example in the context of a plasma source comprising a plurality of electrodes that are arranged relative to a substrate and coupling specific ones of the electrodes to specific windings that by changing the length of one winding relative to the others that it is possible to affect the division of power across the substrate. Furthermore, the level of coupling between the individual windings is low which is particularly advantageous in a semiconductor processing environment where low coupling and hence stability of performance is desirable.

It will be appreciated that where provided that a stub tuner 130 will include one or more stubs 130 (FIG. 1 shows two stubs 130*a*, 130*b*) which are shorted or open circuit lengths of transmission line intended to produce a pure reactance at the attachment point, for the line frequency of interest. Any value of reactance can be made, as the stub lengths are varied from zero to half a wavelength. While a single stub may be used, adjusting a single stub tuner is more difficult in that it is necessary to remove the stub, remake the line where the break was, and calculate the new stub length and point of attachment. By using two stubs permanently attached to the line at fixed points of attachment, it is possible to tune by altering the stub lengths.

For the sake of simplicity however, FIG. 2 shows an arrangement incorporating one stub. It will be appreciated from an examination of FIG. 2, that at the location of the first stub 150 that the current is discontinuous but to the right of that first stub 150 that a standing wave is generated. These graphs show simulated results for profiles versus position of both current and voltage (together with their associated phases) along the main transmission line and a single stub. In this simulated result, the 'short' on the far right—equivalent to the short provided at the end 160 of the transmission line in FIG. 1 in combination with loading caused by the windings in FIG. 1, is modelled for Z=4+j25 Ohms. It will be appreciated that this is not a 'pure short' (Z=0) but resembles something close to what you might get with the secondaries inserted into the system and some sort of resistive load on the output of the secondaries. To this end it will be appreciated that the term "short" as used herein refers to the electrical properties of the transmission line disregarding the electrical contribution by the secondary windings. For the sake of completeness we detail here that the stub lengths are 1.4655 meters to the loaded short and 0.4578 meters to the pure short—along the tuning stub, but again it will be understood that these Figures are exemplary and non-limiting of arrangements that may be provided in accordance with the teaching of the present invention.

Figure 3:
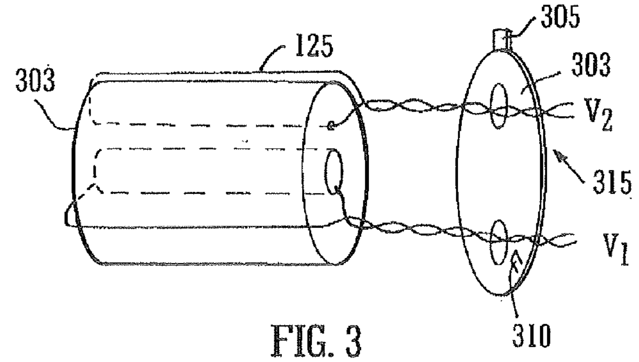
FIG. 3 is a schematic showing an insert that may be provided within the transmission line to provide the N-secondary former.
Figure 4:
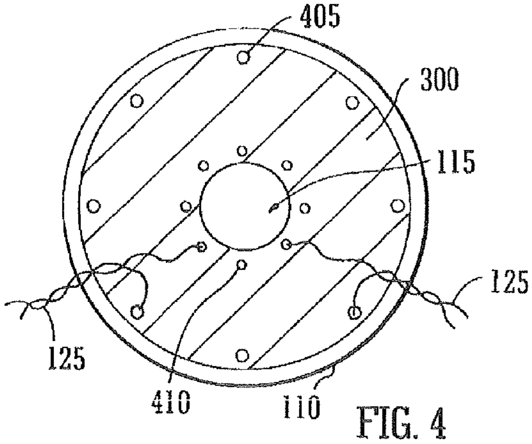
FIG. 4 is an end view of the multi-stub tuner with windings of the N-secondary former provided in a twisted pair arrangement through holes in a shorted end-plate of the tuner.
Figure 2A:
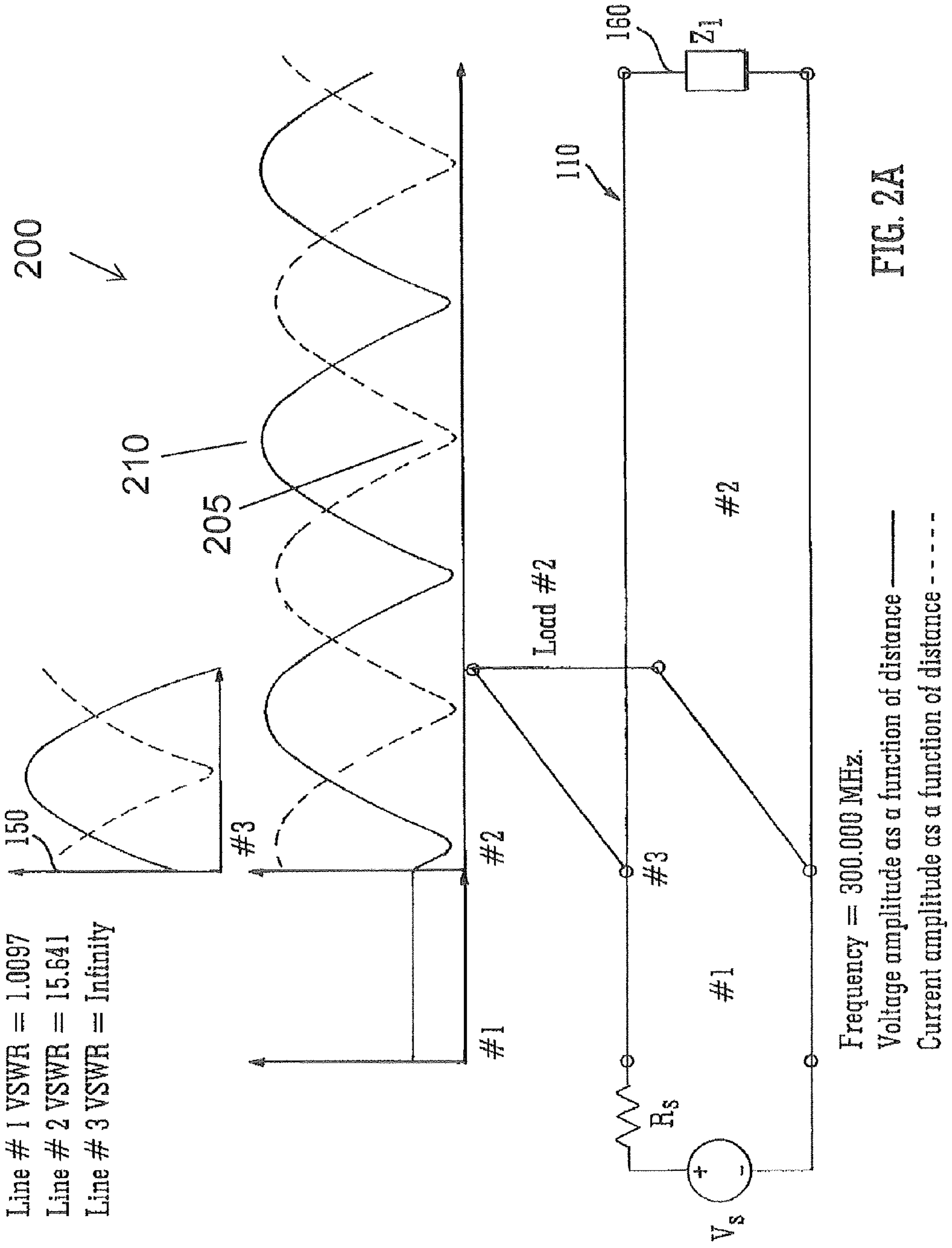
FIG. 2A shows current and voltage profiles versus position along a transmission line incorporating a single stub and provided with a load across the end of the transmission line.
Figure 2B:
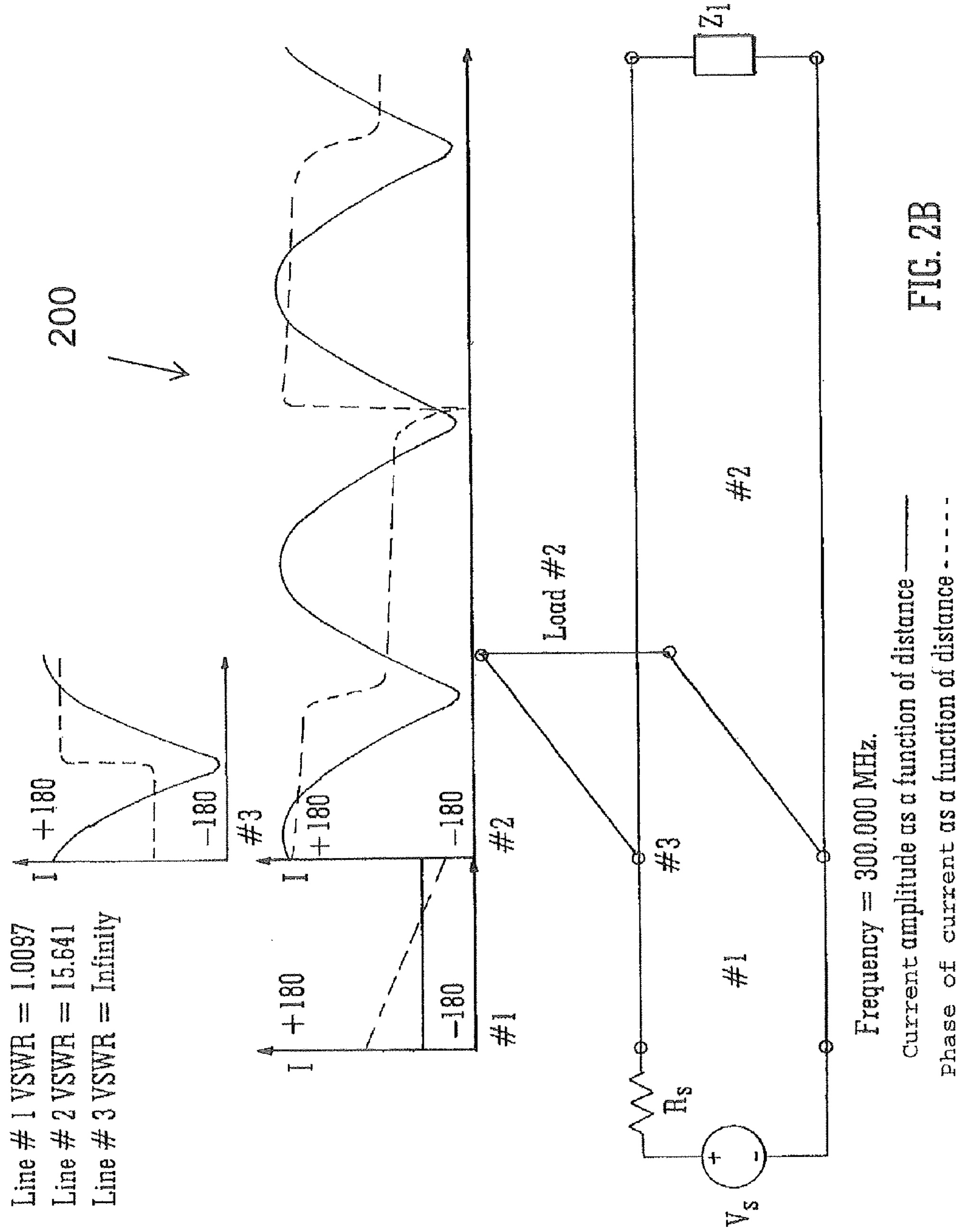
FIG. 2B shows the current and its associated phase for the graph of FIG. 2A.
Figure 2C:
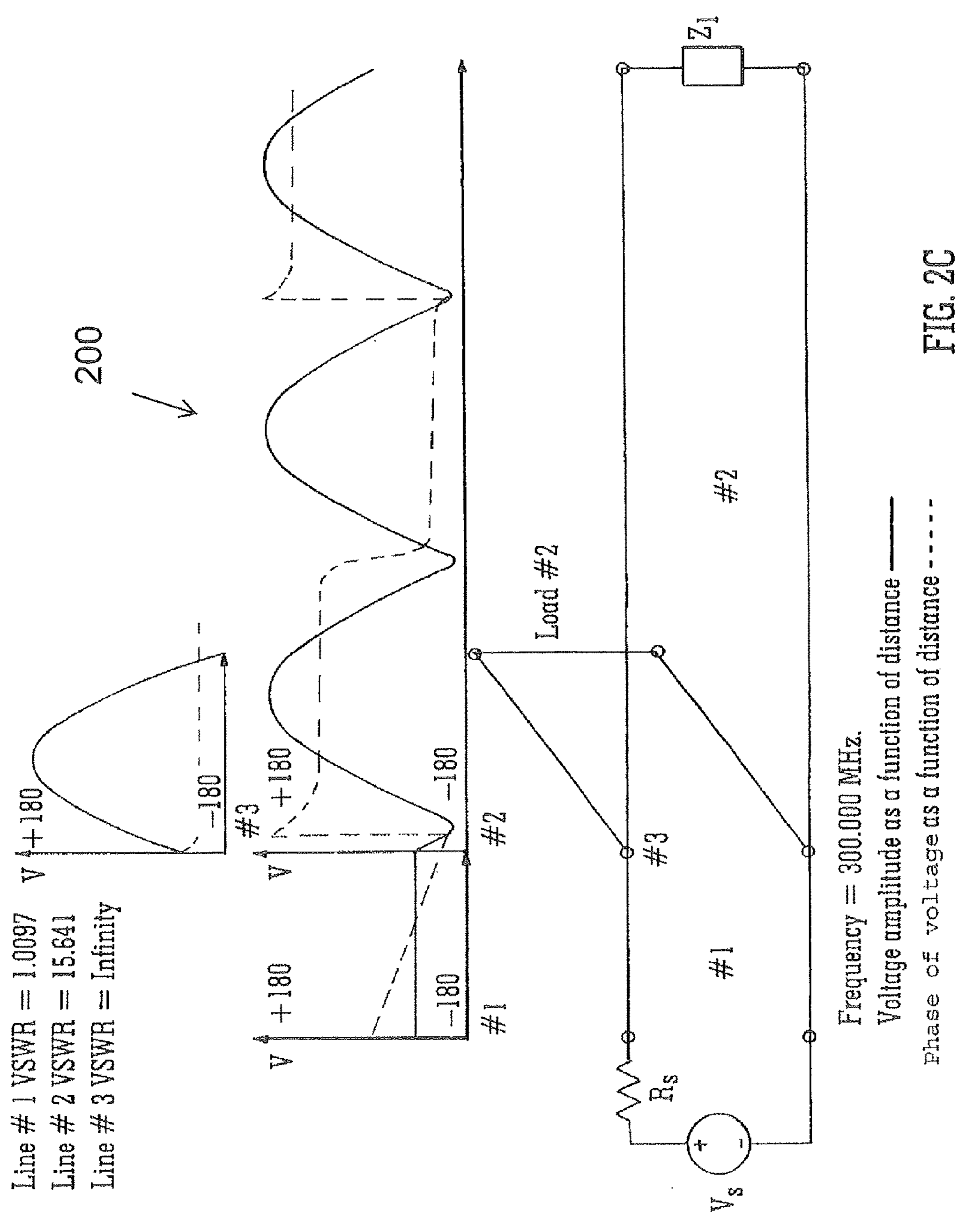
FIG. 2C shows voltage and its associated phase for the graph of FIG. 2.

FIGS. 3 and 4 show in schematic form an example of a former 300 on which the secondary windings 125 are wound. The former may be fabricated from Teflon™ or some other suitable material and provides a template on which the windings may be located. By providing the windings on the former prior to insertion of the windings into the transmission line, it is possible to ensure that the desired degree of overlap between the two is effected. The Figures show both the structure of the windings, and a methodology that may be employed for having the pairs of wires from the two ends of each winding exit the transformer region, but it will be understood that these are schematic in form and exemplary of the type of arrangement that may be employed and it is not intended to limit the teaching to any one specific geometry except as may be deemed necessary in the light of the appended claims. The example of FIG. 3 shows pairs of wires exiting the transmission line through holes 303 in a conducting plate or flange 305 that serves as the short for the transmission line. In the example of FIG. 3, two pairs 310, 315 are shown and said pairs of wires necessarily have differential RF current driven into them. A twisted-pair transmission line can then carry the RF current to a pair of electrodes provided as part of the plasma source and not shown. In FIG. 4 a plurality of windings could be provided in a circumferential arrangement about the inner core 115. The windings could be threaded through apertures 405, 410 provided within the former and arranged radially both distally and proximally to the centre point (where the core 115 is located) respectively. The windings 125 could then exit, as shown in FIG. 3, through the shorted end-plate or flange 305 (not shown in FIG. 4).

Because the current distribution in the transmission line 110 is uniform in the theta direction (current towards the short on the central conductor and current flowing away from the short on the outer conductor at one particular point in RF phase) the azimuthal magnetic field is uniform in strength. In the scenario where a short is provided on the transmission line and a standing wave is generated, for secondary windings that have lengths shorter than ¼ wavelength of the standing wave generated, the direction of the magnetic field is constant, and the induced current (differential-voltage) is in-phase.

All further descriptions will be made assuming that the length of the secondary winding is substantially shorter than ¼ wavelength of the standing wave generated. In such an arrangement the azimuthal magnetic field is substantially in phase and the power is coupled more efficiently.

In the arrangement of FIG. 3, both ends of the twisted pair are used to generate a differential output. In an alternative arrangement, one end of the secondary winding can be connected to the short (zero-voltage point) and the other end would give a single-ended output. If alternate windings within the transformer were connected to the short, then the alternate (single-ended) wires would be 180-degrees out of phase with each other, and such a system could be used to drive alternating current (voltage) in alternate electrodes.

It will be noted that by controlling the mechanical tolerances in the former of the secondary windings, the power splitting balance can be controlled. Also, by increasing (decreasing) the length of selected winding along the transmission line, the fractional power coupled into those windings can be increased or decreased appropriately. This could be done, for example to compensate for additional plasma loss terms occurring at the plasma edge by increasing the power coupling to the edge electrodes. Further modifications that could be used to affect the induced magnetic field include changing the electric and/or magnetic permeability of the former or the properties of the wiring used to generate the windings. While the arrangement of FIG. 1 shows the transformer 120 as being statically mounted relative to the transmission line 116, it will be understood that in other configurations a slide arrangement or other mounting configuration could be used for dynamically changing the degree of overlap between the windings and the transmission line. By moving the transformer 120 and its mounted windings relative to the transmission line the power coupling will also change and this could be used for varying the amount of coupling required. A motor means or other suitable means may be provided for affecting movement for control of the overlap of a winding with the transmission line.

Figure 11C:
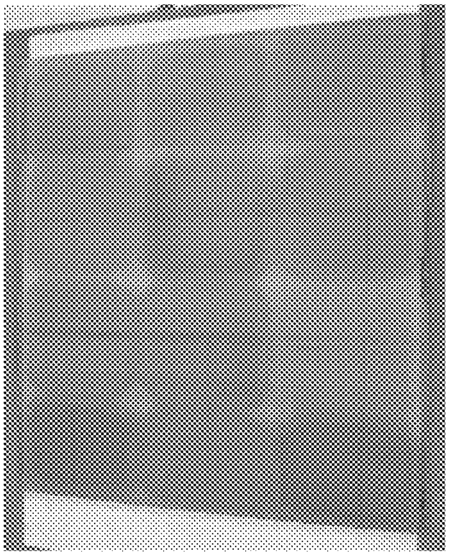
FIGS. 11*a*, 11*b* and 11*c* (bottom, middle, top) are graphical representations of power deposition profiles on substrate as achieved using a multiple tile electrode plasma source as driven using a power splitter in accordance with the present teaching. The graphical representations show the effects of adjustment are made to the power splitting to change power provided to central 2 tiles for a 12-tile system within a 3×4 electrode array for generating a plasma. In this arrangement 6 secondary loops are provided driving 12 tiles. One of the loops feeds the two central tiles.
Figure 11B:
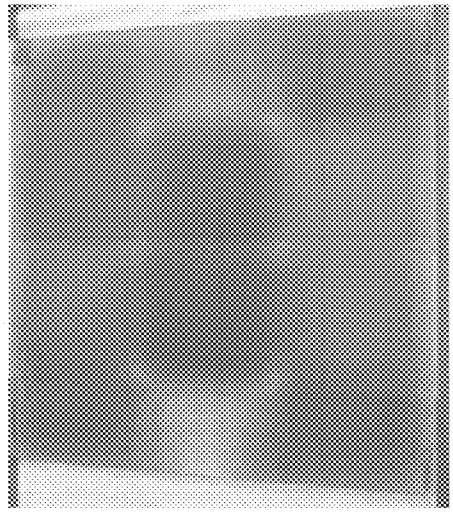
Figure 11A:
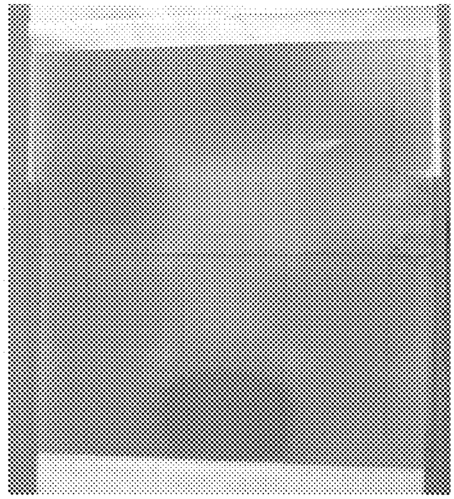

Referring to FIGS. 11*a*, 11*b* and 11*c*, the effects of variation of the winding length or the overlap relative to the primary transmission line on power coupled to an electrode array is shown. The set-up of the power supply to the electrodes provides a power splitting to change power going to central 2 tiles for a 12-tile system with a 3×4 electrode array for generating plasma. In this arrangement 6 secondary loops are provided driving 12-tiles. One of the loops feeds the two central tiles. FIG. 11*a* illustrates a case in which 'too little' power is provided to the two central electrodes, in this case all secondary loops are the same length. FIG. 11*b* illustrates a case in which 'too much' boosted power is provided to central two electrodes in this case by use of an arrangement in which the length of the winding feeding the two central electrodes is increased by ~33%; and FIG. 11*c* illustrates a good power balance at the electrodes obtained by a set-up in which the secondary winding for central two electrodes at ~25% longer than the other 5-windings. It will be appreciated that using a power splitter as provided in accordance with the present teaching enables the efficient splitting of power to each of the electrodes to provide this power balance, which advantageously improves the deposition quality of the plasma system.

It will be appreciated that the magnetic flux that is induced into the windings is to a first order typically constant in a circular geometry about the transmission line. The regions of high current in the standing wave result in a high magnetic field in the theta direction. This provides an easily controlled geometric characteristic that can be used to induce a voltage into the windings that overlap with that magnetic field. As the field is reasonably concentric, a plurality of N windings can be spaced apart from one another within the field, resulting in a plurality of possible power lines taking power from the transmission line. These secondary lines may be arranged circumferentially about the transmission line, desirably being radially arranged on the former. As it is the same magnetic field for each of the windings, if their physical and electrical characteristics are the same then the same voltage will be induced into each winding. By selectively changing the properties of the windings it is possible to change the induced voltage that will be generated.

The number of windings is desirably selected to correspond with the number of devices that need to be powered. Such an arrangement has particular application for providing power to electrodes within a plasma chamber. A particularly advantageous application is the use of such a system in power splitting applications for feeding electrode arrays such as those described in our earlier applications including U.S. No. 11/127,328 and International PCT Application No. PCT/EP2006/062261, where the DC isolation achieved using such a power splitter is particularly advantageous.

Figure 5:
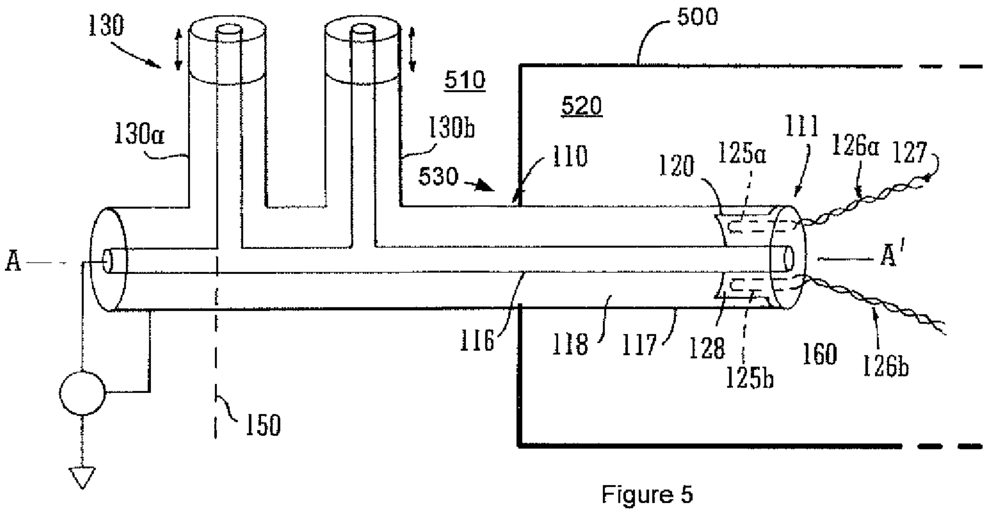
FIG. 5 shows in schematic form how a power splitter in accordance with the present teaching may be integrated into a vacuum chamber.

It will be understood that plasma sources are typically operated within a vacuum environment. FIG. 5 shows in schematic form how a power coupler such as that provided within the context of the present teaching could be usefully employed within such an environment. It will be appreciated that each of the secondary windings provides individual outputs that may require individual input to a vacuum chamber. The provision of multiple individual sealed ports to such a vacuum arrangement is disadvantageous in that if any one of those ports were to leak, the vacuum conditions would be lost. In the arrangement of FIG. 5, such problems are minimised in that the power splitter 110 is used to bridge a vacuum chamber 500. As shown in FIG. 5, a first portion 510 of the splitter 110 is provided external of the vacuum chamber 500 and a second portion 520 is internal to the vacuum chamber 500. A single access point 530 is used and while multiple individual outputs 126 are provided from the splitter, these exit the splitter on the vacuum side of the access point 530 and therefore do not require individual ports to the vacuum chamber. The access point 530 may be sealed in a fashion well understood to those skilled in the art for example by means of a vacuum seal.

Figure 6:
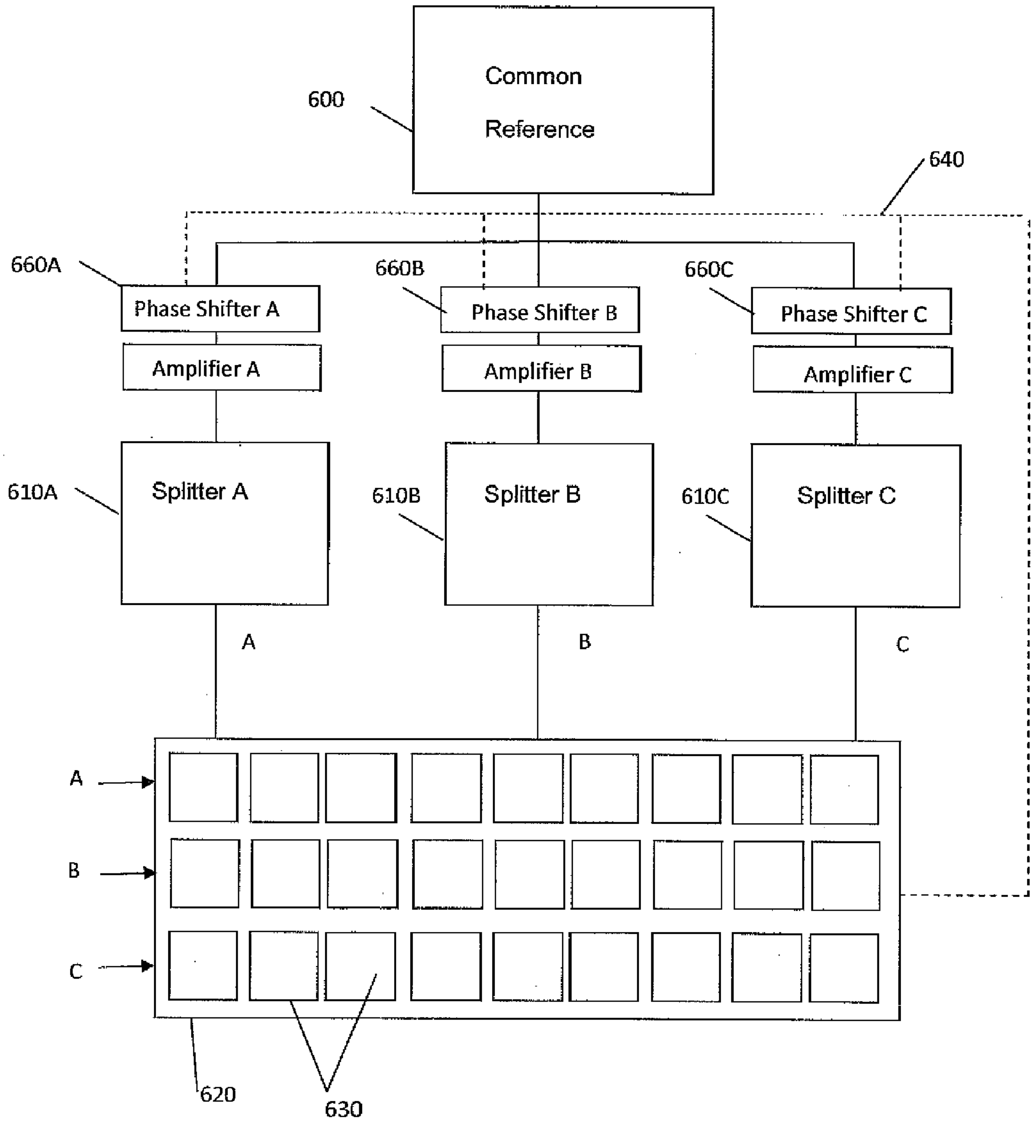
FIG. 6 shows an example of a power arrangement for providing power to a plurality of electrodes within a single plasma source.

The power splitter heretofore described may be provided singly within a circuit or a plurality of splitters may be used collectively. FIG. 6 shows in schematic form an example of how a common reference 600 may be coupled to a plurality of RF power sources 650A, 650B, 650C configured with individual splitters 610A, 6108, 610C to provide power to a plasma source 620, which comprises a plurality of individual plasma electrodes 630. In the exemplary arrangement of FIG. 6, the electrodes 630 are arranged in rows—three rows are shown in this exemplary schematic. The individual rows are coupled to individual ones of the power splitters 660A, 660B, 660C—row A to power splitter A, row B to power splitter B and row C to power splitter C. Each of the power lines A, B, C provide a plurality of individual outputs which are independently provided to individual ones of the electrodes 630. Each of the power splitters may be used to provide a different phase signal to the plasma source 620. A feedback signal line 640, for example in the form of a small pickup loop provided in parallel to the coupling loop may be used to provide an n-phase (n being the number of splitters used) feedback signal to the phase shifters, 660 to ensure that the phase difference in the outputs of splitters 610A, B, C have the desired phase difference.

Figure 7:
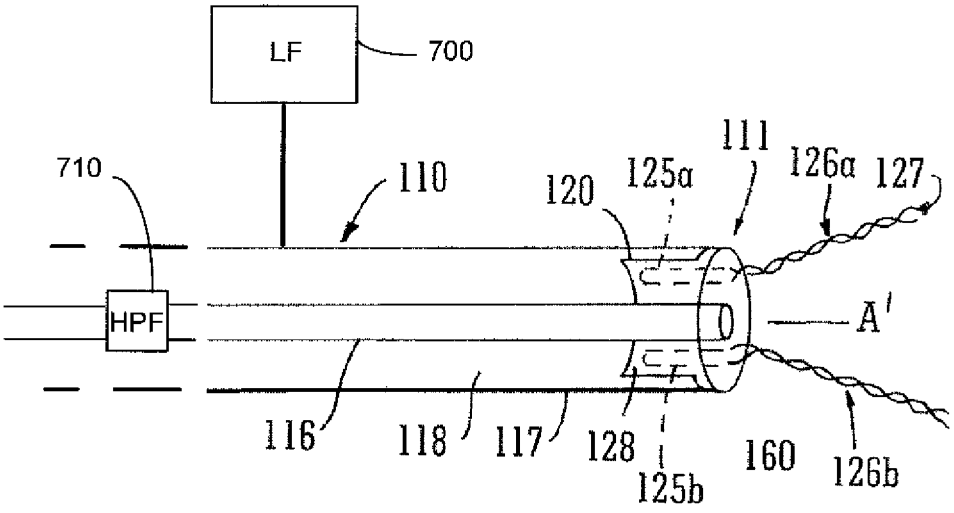
FIG. 7 shows how a power splitter may be modified to couple low frequency power onto the secondary windings.

FIG. 7 shows another arrangement in accordance with the present teaching whereby a LF source 700 is coupled to the outer casing 117. As before, the same reference numerals are used for the same components. A high pass filter HPF, 710 is provided on the transmission line 116 and 117. Similarly to the previous described arrangements the secondary windings receive an induced signal from the transmission line, a high frequency signal which in the example of the secondary windings being coupled to twisted pairs can be arranged to provide a differential output. This arrangement differs in that in this configuration the secondary windings 125 are also capacitively coupled to the outer casing and through the transmission line short to the inner casing, and receive an induced LF common mode signal as provided by the low frequency source 700. The secondary windings are therefore receiving both low frequency common mode signals and a high frequency signal. A shield may be provided to the power source side of the high pass filter, the high pass filter being provided within the shielding region.

Figure 8:
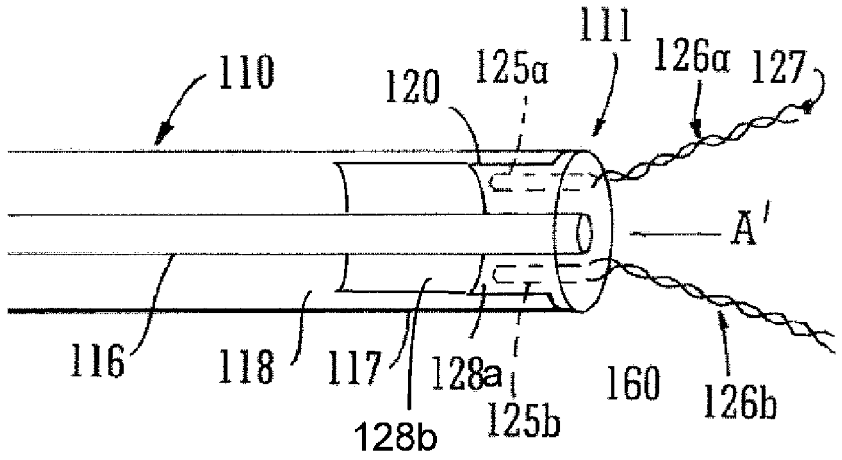
FIG. 8 shows in schematic form how the former may be graded to reduce reflections within the device.

It will be appreciated that the level of signal induced into the secondary windings varies on a number of integers or factors. One such factor is the nature of the former on which the secondary windings are provided. In the exemplary arrangements described, it has been assumed that the nature of the former is consistent along the longitidunal axis of the transmission line and also extending radially out from the transmission line towards the outer casing. FIG. 8 shows an arrangement whereby the material characteristics for example, the dimension or density or dielectric constant of the former are graded along the longitudinal axis. In this arrangement the former may be considered as having a first portion **128*a* coincident with the location of the secondary windings 125 and a second portion 128*b* on the transmission line input side of the first portion. The material used in this second portion 128*b* or the integrity of the material may be varied to grade the differential between the location of the former and the transmission line. An example of how to modify the integrity of the material is by providing a plurality of holes or apertures within the material in this second portion 128*b* so as to modify its physical characteristics. By providing such a grading it is possible to reduce the possibility of reflected signals propagating within the power splitter arising from a reflection of those signals against the leading edge of the former. In a similar fashion the physical characteristics—for example the dimension or density or dielectric constant—of the former could also be varied along the radial axis extending transverse to the longitudinal axis of the transmission line 116**. Control of the grading in the radial direction may be used to affect control of the capacitance between the winding of the secondary and the inner core and outer shield of the primary. Controlling the grading of the former in the axial direction controls reflection and phase velocity. Also noted above in the case that the transmission line is shorted then in a preferred arrangement the former has a dimension not greater than ¼ the wavelength of the standing wave generated. In the case that the transmission line is open ended then in a preferred arrangement the former has a dimension not greater than ½ the wavelength of the standing wave generated.

In such arrangements the power splitter is used to generate a plurality of signals from a single transmission line. However, the system could be used in an inverse fashion as a combiner whereby multiple power sources perhaps of different frequencies, in either single-ended and/or differential signal format, could be coupled into a single transmission line which can be coupled to an antenna for broadcast purposes. Examples of such applications include the provision of signals for mobile telecommunication antenna where for example in a patch or microstrip antenna, a plurality of out-of-phase signals are required for transmission purposes. It is known to use power splitters in such environments but it will be understood that a power splitter as provided within the context of the present teaching with its ability to split an input signal to an arbitrary number, n, of secondary output signals each of which could be configured to have its own power level. One could also use such a power splitter for steering antenna purposes by changing the phase delay between individual loops and the corresponding antenna element.

Figure 9:
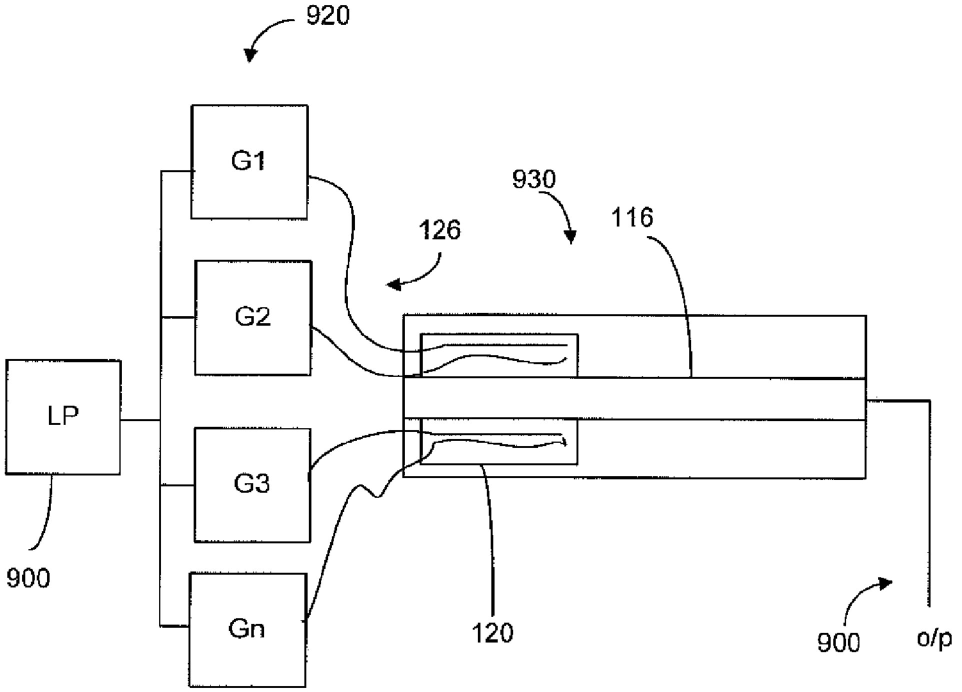
FIG. 9 shows an example of how a device in accordance with the present teaching may be employed to provide a coupling of power from N individual amplifiers to provide a single high power output.

A power combiner as provided in accordance with the teaching of the present specification can be considered as having application to any environment where a broadband signal is required. By using such a power combiner it is possible to provide a broadband RF amplifier where for example multiple-deck amplifiers are combined into a single high-output source. By driving multiple gain devices operable at the same frequency within individual signals from a common low power source and then combining the outputs of those devices using a combiner in accordance with the present teaching it is possible to provide at the output of such a device a high output source. As the input signals are inductively coupled into the transmission line, the device is tolerant to mismatch between individual lines. In the power combiner, the individual secondary windings generate an azimuthal field to couple power in to the transmission line. Effectively the field from each loop or winding adds and the total azimuthal field generated is the sum of the individual contributions. FIG. 9 shows an example of such a power combiner, where a single low power frequency source 900 is coupled to a plurality n of different gain devices 910 $G_1$, $G_2$, $G_n$ each operating at the same frequency which are then coupled together using a power combiner 920 to provide a high power output 930. While tuning stubs are not provided in this schematic, it will be understood that they may or may not be required depending on the application.

Figure 10:
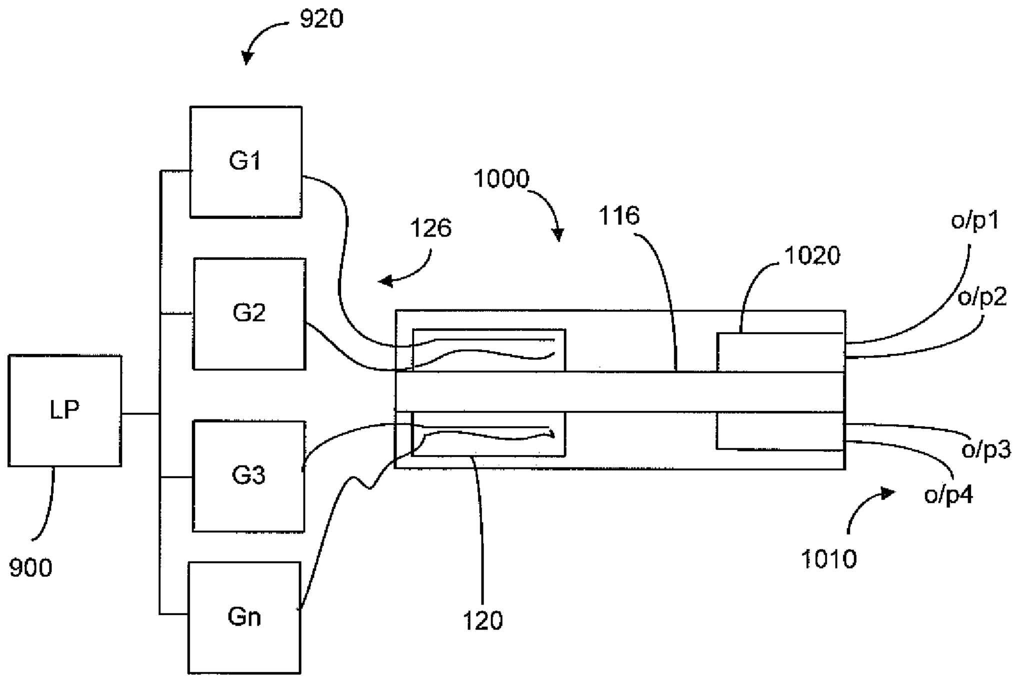
FIG. 10 shows a modification to the device of FIG. 9 so as to provide a second former on the opposing end of the transmission line to that of the former providing the support for the secondary windings at the input end, the second former arranged to provide a support for a second set of secondary windings.

It will be understood that heretofore the operation of a device providing for the coupling of power/signals from a plurality of secondary windings onto a transmission line or vice versa has been described with reference to either alternative a device in accordance with the present teaching could be used to provide a combined combiner-splitter where two or more individual signals are combined onto the transmission line and then split again to provide a feed for two or more output lines. FIG. 10 shows an example of such an arrangement 1000 which is based on the power combiner of FIG. 9. As opposed to provide a single output, as was provided in FIG. 9, in this arrangement a second former 1020 is provided on the opposing end of the transmission line 116 to that of the former providing the support for the secondary windings at the input end. This second former 1020 provides a support for a second set of secondary windings, these being within the azimuthal magnetic field of the transmission line 116 and coupling the power introduced at the first end out of the device to a plurality of individual outputs 1010 (o/p1, o/p2, o/p3, o/p4). While tuning stubs are not provided in this schematic, it will be understood that they may or may not be required depending on the application.

Additionally, in a preferred embodiment the power combiner is configured such that the input loops are tuned to a very narrow bandwidth such that different loops can be operated at different frequencies without interacting with other input loops. In this way multiple frequencies can be coupled into a single transmission line. The input loops may be tuned by adding a capacitor between the input pair of wires forming a series L-C resonator at w^2=1/(L*C) where w is the angular frequency of the resonator, L is the inductance of the input loop, and C is the capacitor across the input wire pair. It will be appreciated by those skilled in the art that stray capacitance and inductance may shift the actual resonant frequency. Employing a variable capacitor would allow the resonant frequency to be tuned in-situ. As would be known by those skilled in the art, multiple components could be used to affect the narrow resonance, including adding a filter external to the power splitter. In this way multiple frequencies can be coupled into a single transmission line. Such an application is particularly advantageous in TV and radio broadcast system where there is a desire to provide for broadcasting of such multiple frequencies—individual frequencies being associated with individual channels.

While it is not intended to limit the present teaching in any way it will be appreciated that a power splitter of the present specification has a number of advantages for applications as an electrode power source for plasma generation. The arrangement provides a truly broadband source with an operation range for example, to the order of 80 to 400 MHz. In the prior art often a single frequency splitter was provided for use with a dedicated coupling module for coupling power to the electrodes at a single frequency such an arrangement could not handle multiple frequencies. If a different frequency was to be applied then a further dedicated power module was required. The present arrangement provides excellent flexibility in the generation of plasmas and the control thereof by providing a broadband source. It is known that a plasma source operated at different frequencies can be optimized for different process steps, for example different steps in the manufacturing of an integrated circuit. Previously, different chambers, operated at different frequencies, achieved different levels of optimization of a process step. As a result, different chambers were selected for different process steps. Chambers with multiple discrete frequencies have been developed to allow more processess to be performed in a single chamber. Using a broadband system, each process could be run at the frequency that optimizes the individual process. With multiple processess being able to be run in a single chamber.

In addition, the power splitter offers a high degree of isolation between different output ports; this provides for increases stability in application to the plasma source, as changes in the loading impedence of one coupling loop does not effect the power division to the other coupling loops.

Therefore although the invention has been described with reference to exemplary illustrative embodiments it will be appreciated that specific components or configurations described with reference to one Figure may equally be used where appropriate with the configuration of another figure. Any description of these examples of the implementation of the invention are not intended to limit the invention in any way as modifications or alterations can and may be made without departing from the spirit or scope of the invention. It will be understood that the invention is not to be limited in any way except as may be deemed necessary in the light of the appended claims.

The words comprises/comprising when used in this specification are to specify the presence of stated features, integers, steps or components but does not preclude the presence or addition of one or more other features, integers, steps, components or groups thereof.

The invention claimed is:

1. A power splitter comprising a single coaxial transmission line comprising an inner and outer conductor and having a plurality of N secondary windings contained within a structure of the single coaxial transmission line and arranged about the single coaxial transmission line between the inner and outer conductors, the single coaxial transmission line operably providing an azimuthal magnetic field which inductively couples power into the plurality of N secondary windings to provide an N splitting of the power from the single coaxial transmission line, and wherein the single coaxial transmission line is shorted so as to operably generate a standing wave on the single coaxial transmission line.

2. The power splitter of claim 1 comprising an impedance matching circuit coupled to the single coaxial transmission line.

3. The splitter of claim 2 wherein the impedance matching circuit includes a stub tuner.

4. The splitter of claim 3 wherein the stub tuner is a multi-stub tuner.

5. A power splitter, comprising:

a single coaxial transmission line comprising an inner and outer conductor; and a plurality of N secondary windings contained within a structure of the single coaxial transmission line and arranged about the single coaxial transmission line between the inner and outer conductors, the single coaxial transmission line operably providing an azimuthal magnetic field which inductively couples power into the plurality of N secondary windings to provide an N splitting of the power from the single coaxial transmission line.

6. The splitter of claim 1 wherein the short causes a zero-voltage point and simultaneously a maximum in current point, the current effecting generation of the azimuthal magnetic field.

7. The splitter of claim 6 wherein the plurality of N secondary windings are located proximal to the short and extend axially along the single coaxial transmission line from the short.

8. The splitter of claim 1 wherein the plurality of N secondary windings are provided on a former located in a region of the azimuthal magnetic field.

9. The splitter of claim 7 wherein the plurality of N secondary windings are provided in a pair arrangement on a former located in a region of the azimuthal magnetic field.

10. The splitter of claim 9 wherein individual ones of the pairs are shorted to create a single ended output.

11. The splitter of claim 10 having 2N pairs of windings wherein half of the 2N pairs of windings are shorted on one end and half of the 2N pairs of windings are shorted on the other end to provide N push pull pairs.

12. The splitter of claim 11 wherein individual ones of the N push pull pairs provide a differential output.

13. The splitter of claim 9 wherein the former has a dimension not greater than ¼ of a wavelength of the standing wave generated.

14. The splitter of claim 9 wherein properties of the former are selectable to affect the induced power into the plurality of N secondary windings.

15. The splitter of claim 1, wherein the plurality of N secondary windings comprise N secondary coaxial cables arranged about side walls of the single coaxial transmission line such that power is induced in the secondary N coaxial cables.

16. The power splitter of claim 5 comprising an outer casing defining an exterior of the splitter, the splitter further comprising a low power source coupled to the outer casing of the splitter, the low power source operably providing for a capacitive coupling of power to the plurality of N secondary windings.

17. The splitter of claim 15 wherein the induced power is derived from a radial electrical field in the single coaxial transmission line.

18. The splitter of claim 15 wherein the power induced on the N secondary coaxial cables is in phase.

19. The splitter of claim 15, wherein the N secondary coaxial cables comprise inner and outer conductors which are arranged such that the outer conductors of the N secondary coaxial cables are attached to the outer conductor of the single coaxial transmission line and the inner conductors of the N secondary coaxial cables insulated from the outer conductors of the N secondary coaxial cables are attached to the inner conductor of the single coaxial transmission line.

20. A power combiner, comprising:

a single coaxial transmission line comprising an inner and outer conductor; and a plurality of N secondary windings contained within a structure of the single coaxial transmission line and arranged about the single coaxial transmission line between the inner and outer conductors, the plurality of N secondary windings operably coupling power onto the single coaxial transmission line so as to combine the power from each of the plurality of N secondary windings onto the single coaxial transmission line.

21. The splitter of claim 15 wherein the length between the short and the position where inner and outer conductors of the N secondary coaxial cables are connected to the single coaxial transmission line is controlled to control the relative power coupling between the N secondary coaxial cables.

22. The splitter of claim 15 further comprising M internal secondary coaxial cables arranged internal to the inner conductor of the single coaxial transmission line such that power is induced in the M internal secondary coaxial cables.

23. The splitter of claim 22, the M internal secondary coaxial cables having inner and outer conductors arranged such that the outer conductors of the M internal secondary coaxial cables are connected to the inner conductor of the single coaxial transmission line and the inner conductors of the M internal secondary coaxial cables are connected to the outer conductor of the single coaxial transmission line.

24. The splitter of claim 22 wherein the power induced on the M internal secondary coaxial cables is in phase.

25. The splitter of claim 22 wherein the N and M secondary coaxial cables are arranged such that distance from the short of the single coaxial transmission line to the location of the inner conductors of the N and M secondary coaxial cables is the same so that the phase of the power induced in the N secondary coaxial cables is 180 degrees out of phase with the power induced in the M secondary coaxial cables.

26. The splitter of claim 25 wherein the distance between the short and location of the inner and outer conductors of N and M secondary coaxial cables is controlled to control the relative power coupling between the N and M secondary coaxial cables.

27. The splitter of claim 22 wherein M=N thereby providing N push pull pairs.

28. The splitter of claim 1 wherein the mechanical and/or electrical properties of the plurality of N secondary windings are selectable to vary to the induced power that is coupled into each of the individual plurality of N secondary windings.

29. The splitter of claim 8 wherein the physical characteristics of the former are configured to reduce generation of reflections within the splitter.

30. The splitter of claim 8 wherein the former is moveable relative to the single coaxial transmission line, a movement of the former effecting a change in the power coupled into the plurality of N secondary windings.

31. The splitter of claim 1 wherein individual ones of the plurality of N secondary windings are selectively coupled to electrodes of a plasma source.

32. The splitter of claim 1 wherein selected ones of the plurality of N secondary windings provide a push pull wiring arrangement, each of the selected plurality of N secondary windings having a first and second end, each of the first and second ends forming the push pull arrangement being operably coupled to neighboring electrodes of a plasma source so as to provide power to each of the neighboring electrodes out of phase with one another.

33. The splitter of claim 1 comprising an outer casing defining the exterior of the splitter, the splitter further comprising a low power source coupled to the outer casing of the splitter, the low power source operably providing for a capacitive coupling of power to the plurality of N secondary windings.

34. The splitter of claim 1 wherein the single coaxial transmission line is coupled at its input to an RF source.

35. A power splitter comprising a single coaxial transmission line comprising an inner and outer conductor and having at least one secondary winding contained within a structure of the single coaxial transmission line configured to provide a differential output and being arranged about the single coaxial transmission line between the inner and outer conductors, the single coaxial transmission line operably providing an azimuthal magnetic field which inductively couples power into the at least one secondary winding and wherein the single coaxial transmission line is shorted so as to operably generate a standing wave on the single coaxial transmission line.

36. A plasma source comprising a power splitter as claimed in claim 1.

37. The plasma source of claim 36 comprising a plurality of N individual plasma electrodes, the power splitter providing for an N splitting of the power from the single coaxial transmission line for individual ones of the plurality of N individual plasma electrodes.

38. The plasma source of claim 37 wherein the individual ones of the plurality of N individual plasma electrodes are each coupled to one wire of a twisted pair originating from the power splitter.

39. The plasma source of claim 37 wherein the plurality of N individual plasma electrodes are provided in a vacuum chamber, the power splitter being arranged to pass through a wall of the vacuum chamber such that a first side of the power splitter is within the vacuum and a second side of the power splitter is outside the vacuum.

40. A power combiner comprising a single coaxial transmission line comprising an inner and outer conductor and having a plurality of N secondary windings contained within a structure of the single coaxial transmission line and arranged about the single coaxial transmission line between the inner and outer conductors, the plurality of N secondary windings operably coupling power onto the single coaxial transmission line so as to combine the power from each of the plurality of N secondary windings onto the single coaxial transmission line and wherein the single coaxial transmission line is shorted so as to operably generate a standing wave on the single coaxial transmission line.

41. The power combiner of claim 40 comprising an impedance matching circuit coupled to the single coaxial transmission line.

42. The combiner of claim 41 wherein the impedance matching circuit includes a stub tuner.

43. The combiner of claim 42 wherein the stub tuner is a multi-stub tuner.

44. A power splitter combiner arrangement, comprising:

a power splitter having:

a single coaxial transmission line comprising an inner and outer conductor; and a plurality of N secondary windings contained with a structure of the single coaxial transmission line and arranged about the single coaxial transmission line between the inner and outer conductors, the single coaxial transmission line operably providing an azimuthal magnetic field which inductively couples power into the plurality of N secondary windings to provide an N splitting of the power from the single coaxial transmission line; and a power combiner having:

a single coaxial transmission line comprising an inner and outer conductor; and a plurality of N secondary windings contained with a structure of the single coaxial transmission line of the power combiner and arranged about the single coaxial transmission line of the power combiner between the inner and outer conductors, the plurality of N secondary windings operably coupling power onto the single coaxial transmission line so as to combine the power from each of the plurality of N secondary windings onto the single coaxial transmission line of the power combiner.

45. The combiner of claim 40 wherein the short operably causes a zero-voltage point and simultaneously a maximum in current point, the current effecting generation of an azimuthal magnetic field.

46. The combiner of claim 45 wherein the plurality of N secondary windings are located proximal to the short and extend axially along the single coaxial transmission line from the short.

47. The combiner of claim 46 wherein the plurality of N secondary windings are provided on a former located in a region of the azimuthal magnetic field.

48. The combiner of claim 47 wherein the plurality of N secondary windings are provided in a pair arrangement on a former located in the region of the azimuthal magnetic field.

49. The combiner of claim 48 wherein individual ones of the pairs are shorted to create a single ended input.

50. The combiner of claim 49 comprising a differential input.

51. The combiner of claim 49 wherein the plurality of N secondary windings are provided with single ended inputs with one end grounded.

52. The combiner of claim 47 wherein the former has a dimension not greater than ¼ of a wavelength of the standing wave generated.

53. The combiner of claim 48 wherein properties of the former are selectable to affect the induced power transferred by the plurality of N secondary windings.

54. The combiner of claim 40 wherein inputs of the plurality of N secondary windings are tuned to a narrow bandwidth such that different windings are operable at different frequencies without interacting with other inputs of the plurality of N secondary windings thereby providing for the coupling of multiple frequencies into a single coaxial transmission line.

55. The combiner of claim 40 wherein the mechanical and/or electrical properties of the plurality of N secondary windings are selectable to vary to the induced power that is coupled by each of the individual plurality of N secondary windings.

56. The combiner of claim 55 wherein the physical characteristics of the former are configured to reduce generation of reflections within the combiner.

57. A power splitter combiner arrangement comprising a power splitter comprising a single coaxial transmission line comprising an inner and outer conductor and having a plurality of N secondary windings contained within a structure of the single coaxial transmission line and arranged about the single coaxial transmission line between the inner and outer conductors, the single coaxial transmission line operably providing an azimuthal magnetic field which inductively couples power into the plurality of N secondary windings to provide an N splitting of the power from the single coaxial transmission line, and wherein the single coaxial transmission line is shorted so as to operably generate a standing wave on the single coaxial transmission line; and a power combiner comprising a single coaxial transmission line comprising an inner and outer conductor and having a plurality of N secondary windings contained within a structure of the single coaxial transmission line of the power combiner and arranged about the single coaxial transmission line of the power combiner between the inner and outer conductors, the secondary windings operably coupling power onto the single coaxial transmission line so as to combine the power from each of the plurality of N secondary windings onto the single coaxial transmission line of the power combiner and wherein the single coaxial transmission line of the power combiner is shorted so as to operably generate a standing wave on the single coaxial transmission line of the power combiner.

58. A signal combiner comprising a combiner as claimed in claim 40.

* * * * *